(12) United States Patent
Sandberg et al.

(10) Patent No.: US 10,347,605 B2
(45) Date of Patent: Jul. 9, 2019

(54) SYSTEM AND METHOD FOR ROUTING SIGNALS IN COMPLEX QUANTUM SYSTEMS

(71) Applicant: INTERNATIONAL BUSINESS MACHINES CORPORATION, Armonk, NY (US)

(72) Inventors: Martin O. Sandberg, Ossining, NY (US); David C. McKay, Ossining, NY (US); Patryk M. Gumann, Tarrytown, NY (US); Hanhee Paik, Danbury, CT (US); Jay M. Gambetta, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/823,817

(22) Filed: Nov. 28, 2017

(65) Prior Publication Data

US 2019/0164935 A1 May 30, 2019

(51) Int. Cl.
*H01L 39/02* (2006.01)
*H01L 25/065* (2006.01)
(Continued)

(52) U.S. Cl.
CPC ......... *H01L 25/0657* (2013.01); *G06N 10/00* (2019.01); *H01L 21/76898* (2013.01);
(Continued)

(58) Field of Classification Search
CPC .................................................. G06N 99/002
See application file for complete search history.

(56) References Cited

U.S. PATENT DOCUMENTS 9,152,924 B2   10/2015  Bonderson et al.
9,455,391 B1*  9/2016  Nayfeh ............... G06N 99/002
(Continued)

FOREIGN PATENT DOCUMENTS

CN   105957832 A    9/2016
CN   107016442 A    8/2017
WO   2016199029 A1  12/2016

OTHER PUBLICATIONS

Béjanin et al., "The Quantum Socket: Three-Dimensional Wiring for Extensible Quantum Computing", arXiv:1606.00063v1, May 31, 2016, pp. 1-35.
(Continued)

*Primary Examiner* — Benjamin P Sandvik
(74) *Attorney, Agent, or Firm* — Michael A. Petrocelli

(57) ABSTRACT

Embodiments of the present invention disclose a computer system having a plurality of quantum circuits arranged in a two-dimensional plane-like structure, the quantum circuits comprising qubits and busses (i.e., qubit-qubit interconnects), and a method of formation therefor. A quantum computer system comprises a plurality of quantum circuits arranged in a two-dimensional pattern. At least one interior quantum circuit, not along the perimeter of the two-dimensional plane of the plurality of quantum circuits, contains a bottom chip, a device layer, a top chip, and a routing layer. A signal wire connects the device layer to the routing layer, wherein the signal wire breaks the two dimensional plane, for example, the signal wire extends into a different plane.

11 Claims, 6 Drawing Sheets

(51) Int. Cl.
*H01L 23/00* (2006.01)
*H01L 25/00* (2006.01)
*H01L 21/768* (2006.01)
*H01L 27/18* (2006.01)
*G06N 10/00* (2019.01)

(52) U.S. Cl.
CPC .............. *H01L 24/05* (2013.01); *H01L 24/48* (2013.01); *H01L 24/85* (2013.01); *H01L 25/50* (2013.01); *H01L 27/18* (2013.01); *H01L 39/02* (2013.01); *H01L 2224/04042* (2013.01); *H01L 2224/4845* (2013.01); *H01L 2224/48091* (2013.01); *H01L 2224/48106* (2013.01); *H01L 2224/48145* (2013.01); *H01L 2224/85121* (2013.01); *H01L 2224/85169* (2013.01); *H01L 2224/85801* (2013.01); *H01L 2225/06506* (2013.01)

(56) References Cited

U.S. PATENT DOCUMENTS

| | | | |
|---|---|---|---|
| 9,570,429 B2 | 2/2017 | Mao et al. | |
| 9,633,314 B2 | 4/2017 | Won | |
| 9,633,935 B2 | 4/2017 | Ho et al. | |
| 2011/0108744 A1* | 5/2011 | Stevenson | B82Y 10/00 |
| | | | 250/493.1 |
| 2016/0329896 A1 | 11/2016 | Bronn et al. | |
| 2017/0033087 A1 | 2/2017 | Chen | |
| 2017/0061317 A1 | 3/2017 | Chow et al. | |
| 2017/0069564 A1 | 3/2017 | Kwon et al. | |
| 2017/0084813 A1 | 3/2017 | Chang et al. | |
| 2017/0092833 A1 | 3/2017 | Abdo | |
| 2018/0013052 A1* | 1/2018 | Oliver | H01L 25/0657 |

OTHER PUBLICATIONS

Bruno et al., abstract for "Session X48: Scalable Hardware for Superconducting Qubits", Bulletin of the American Physical Society, APS Mar. 14-18, 2016 Meeting, vol. 61, No. 2, 2 pages, http://meetings.aps.org/Meeting/MAR16/Event/269614.

International Search Report and Written Opinion, International Application No. PCT/IB2017/058250, filed Dec. 21, 2017

* cited by examiner

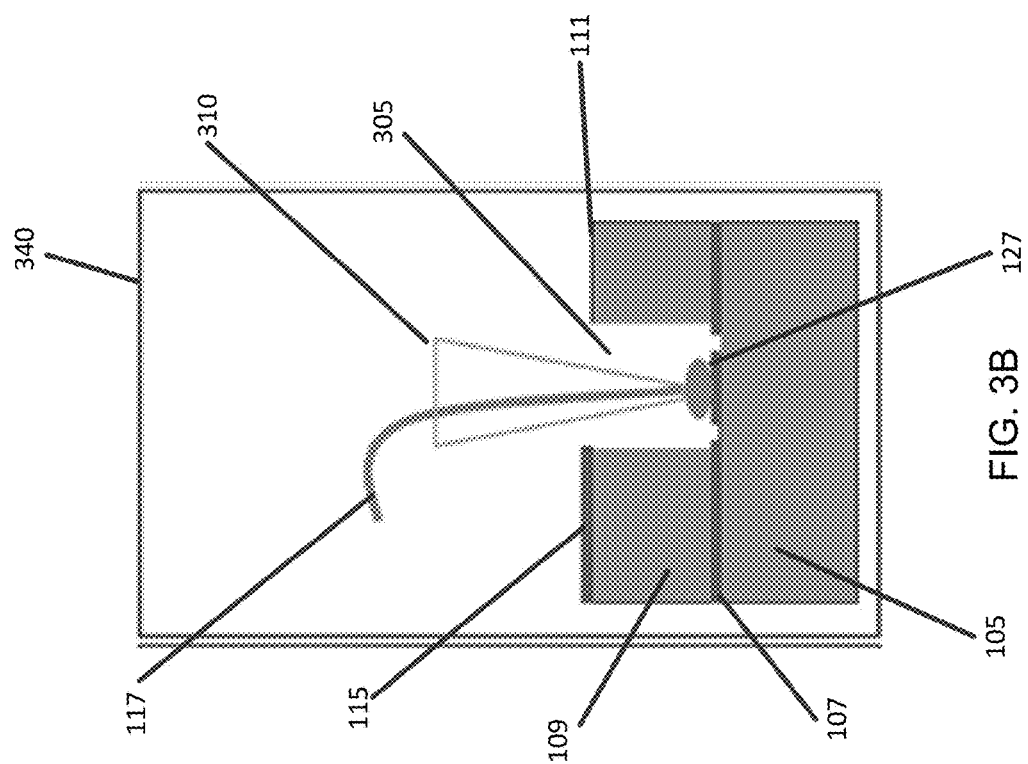

SYSTEM AND METHOD FOR ROUTING SIGNALS IN COMPLEX QUANTUM SYSTEMS

BACKGROUND

The present invention relates generally to the field of quantum computing systems, and more particularly to wiring for interior quantum computing circuits.

BRIEF SUMMARY

Additional aspects and/or advantages will be set forth in part in the description which follows and, in part, will be apparent from the description, or may be learned by practice of the invention.

Embodiments of the present invention disclose a computer system having a plurality of quantum circuits arranged in a two-dimensional plane-like structure, the quantum circuits comprising qubits and busses (i.e., qubit-qubit interconnects), and a method of formation therefor. A quantum computer system comprises a plurality of quantum circuits arranged in a two-dimensional pattern. At least one interior quantum circuit, meaning a quantum circuit not along the perimeter of the two-dimensional plane of the plurality of quantum circuits, contains a bottom chip, a device layer, a top chip, and a routing layer. A signal wire connects the device layer to the routing layer, wherein the signal wire breaks (i.e., is not parallel to) the two dimensional plane, for example, the signal wire extends into a different plane.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIGS. 3A-3C illustrates a wire bonding process to the quantum circuit, in accordance with an embodiment of the present invention.

DETAILED DESCRIPTION

Figure 1:
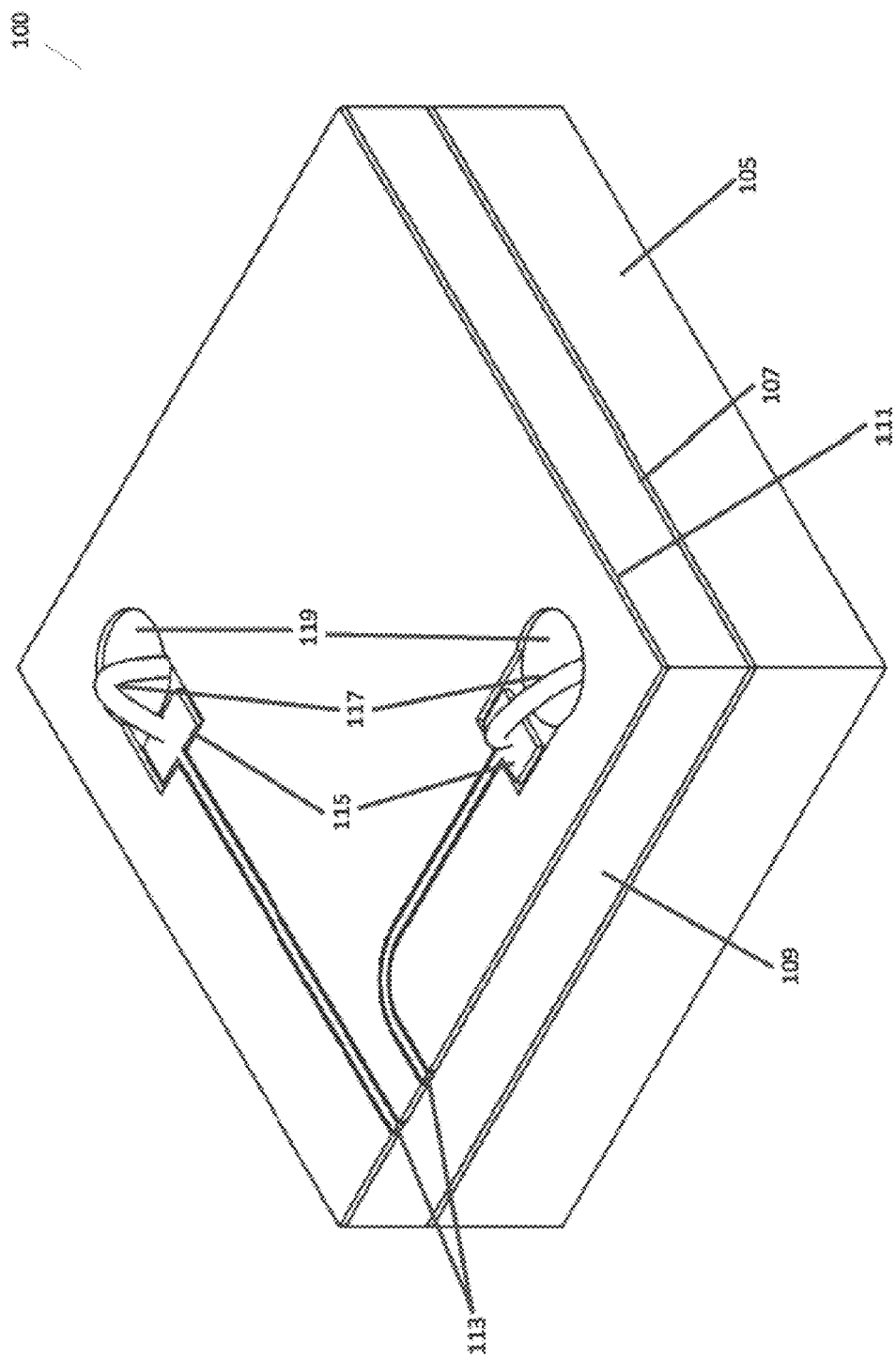
FIG. 1 is an interior quantum circuit, not along the perimeter of the two-dimensional plane of the plurality of quantum circuits, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Reference will now be made in detail to the embodiments of the present invention, examples of which are illustrated in the accompanying drawings, wherein like reference numerals refer to like elements throughout. Embodiments of the invention are generally directed to an interior quantum circuit in a quantum system.

In embodiments of the present invention, a quantum system contains a two-dimensional (2D) lattice of qubits connected by busses. Embodiments of the present invention provide structures, and fabrication methods therefor, for input/output wiring for the quantum circuits arranged in the interior of the lattice. A top-chip (routing chip) may be mounted on top of a bottom chip (device chip), and made from highly pure crystalline silicon. The routing chip may have a routing layer with transmission lines patterned on it without the risk of disturbing qubits in the device chip. The device chip may include a device layer with a plurality of qubits connected by busses. In order to route signals from the routing layer to the device layer, embodiments of the present invention disclose fabricating "through holes" in the top chip. The signal is then transported from a routing layer of the top-chip to the device layer of the bottom chip through a wirebond. In some embodiments, the wirebond is placed though the through hole using a ball-bonding tool, which may allow very narrow capillaries (placing the wire) to be used. Reducing the size of the through hole used allows for more compact circuits. For the top-chip, a standard 8 inch silicon wafer can be used (thicknesses on the order of 750 microns) and through holes can have a diameter of 100 μm to 1000 μm. The diameter of the through hole is limited by the amount of available space. In one embodiment, the through hole has a diameter of 500 μm. Connecting the interior quantum circuits using a through hole allows for the signal lines to be routed to the qubits located on the interior of the lattice and enables communication of the interior qubits with structures outside the two dimensional plane.

Figure 2:
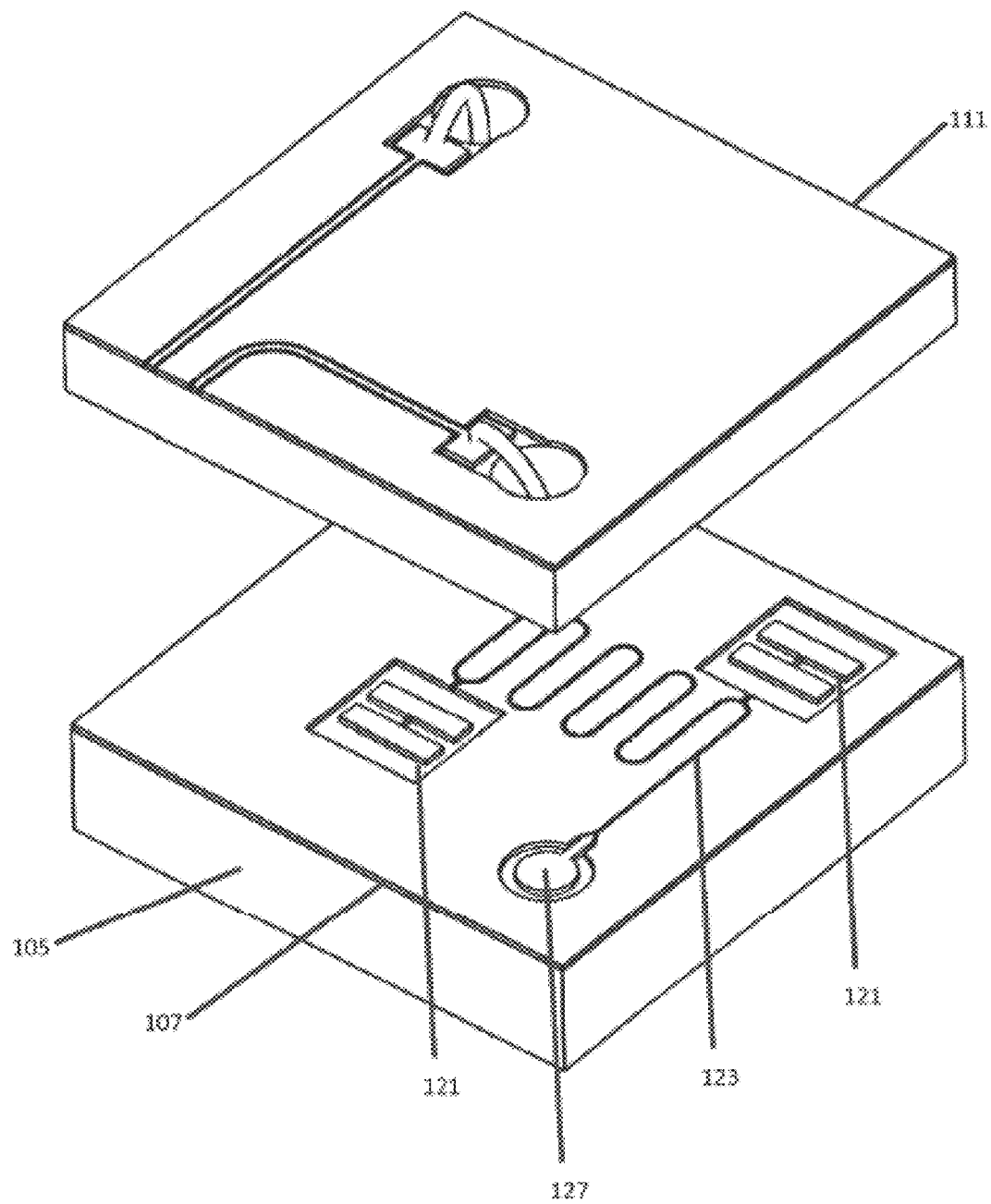
FIG. 2 is an exploded view of the quantum circuit, in accordance with an embodiment of the present invention.

FIG. 1 is an interior quantum circuit, not along the perimeter of the two-dimensional plane of the plurality of quantum circuits, in accordance with an embodiment of the present invention. FIG. 2 is an exploded view of the quantum circuit, in accordance with an embodiment of the present invention.

The interior quantum circuit 100 includes a bottom chip 105, a device layer 107, a top chip 109, a routing layer 111, signal lines 113, bonding pads 115, bond wires 117, and through holes 119. The exploded view of the interior quantum circuit 100, as illustrated by FIG. 2, further illustrates a quantum bit 121, a readout resonator 123, and a bond pad of bonding pads 127. Only one bonding pad of bonding pads 127 is depicted in FIG. 2, but it should be understood that device layer 107 includes a second bond pad (not shown) that is obscured by a portion of top chip 109. Each of bonding pads 127 is located below and aligned with a through hole of though holes 119.

The device layer 107 is formed on top of the bottom chip 105. The device layer 107 includes structures that may comprise at least one superconducting material, for example, Niobium, Aluminum, or other suitable materials. In the depicted embodiment, device layer 107 includes the readout resonator 123, the quantum bit 121, and the bond pad 127.

The quantum bit 121 is a structure that processes units of quantum information (called qubits) that are the quantum analogue of the classical bit. A qubit is a two-state quantum-mechanical system, such as the polarization of a single photon: here the two states are vertical polarization and horizontal polarization. In a classical system, a bit would have to be in one state or the other. However, quantum mechanics allows the qubit to be in a superposition of both states at the same time, a property that is fundamental to quantum computing.

In example embodiments of the present invention, the qubit includes the following properties: during measurement, the qubit is projected into one of two different states (|A⟩ or |B⟩). A successful read-out occurs while the two states |A⟩ and |B⟩ are stable, after which the qubit may decohere. The readout resonator attains a resonance frequency based upon the state of the projected qubit.

The projected state of the qubit can be inferred based on the readout resonator frequency, which can be determined based on the reflection or transmission coefficient of the readout resonator. This can be accomplished through various techniques. In an example technique, a microwave signal is applied to the input of the circuit and is tuned to a frequency approximately equal to the resonance frequency of one of the post measurement quasi-stable states in accordance with one example embodiment. When the qubit is projected into the measured state, the applied microwave signal either transmits to the output or is reflected by the readout resonator, depending on the coupling of the qubit to the transmission lines. Therefore, depending on the qubit state, the microwave signal will acquire a specific magnitude and phase. The determination of the qubit state from this signal can be done in a variety of ways, for example, using IQ mixers, threshold detectors and so forth. Other various methods for measuring frequency or state may be used as well.

The top chip 109 is on top of the device layer 107 and includes the routing layer 111, the signal lines 113, and bonding pads 115.

In some embodiments, counter etched patterns (not shown) are formed in a bottom surface of top chip 109. In some embodiments, an additional through hole (not depicted) is formed in the top chip 109 directly above the bonding pads 127. The counter etched patterns and additional through hole (not depicted) could potentially help to reduce any induced decoherence from the top chip 109 even further. The surface of the top chip 109 that faces the device layer 107 could also be coated with a superconductor, if a counter etched pattern is etched into the top chip 109. The counter etched patterns creates a gap between the readout resonator 123 and the top chip 109, such that the top chip 109 does not contact the readout resonator 123, thereby preventing the top chip 109 from electrically shorting devices on the device layer 107. Coating this face with a superconducting material reduces unwanted (electromagnetic) crosstalk between devices.

There are several ways that the top chip 109 can be aligned to the device layer 107. For example, etched features in the top chip 109 could be aligned to patterned features on the bottom chip 105 by aligning the chips visually. If the features are sufficiently large, visual alignment is possible without use of a microscope.

At least one through hole 119 or a plurality of through holes 119 can be created in the top chip 109. The through hole 119 can be created in the top chip 109 using reactive ion etching, bosch process, laser milling, and/or a mechanical process. The through holes 119 can have a diameter of 100 μm to 1000 μm. The diameter of the through hole is limited by the amount of available space. In one embodiment, the through holes 119 have a diameter of 500 μm. In another example, the through hole 119 can be located in the device layer 107 and the bottom chip 105. This would allow the bond wire 117 to pass through the bottom chip 105 to a bottom routing layer (not shown) that is located on the bottom of bottom chip 105.

In conventional complementary metal-oxide semiconductor (CMOS) technology, connecting interior circuits to an output source may be done by growing dielectric materials on top of the circuit and implementing through plated via-structures. This has not been proven to be possible for quantum circuits because the microwave quality of deposited dielectrics is too low and would cause qubit decoherence.

Quantum decoherence is the loss of quantum coherence. In quantum mechanics, particles such as electrons behave like waves and are described by a wavefunction. These waves can interfere, leading to the peculiar behavior of quantum particles. As long as there exists a definite phase relation between different states, the system is said to be coherent. This coherence is a fundamental property of quantum mechanics, and is necessary for the functioning of quantum computers. However, when a quantum system is not perfectly isolated, but in contact with its surroundings, the coherence decays with time, a process called quantum decoherence. As a result of this process, the quantum behavior is lost.

Decoherence can be viewed as the loss of information from a system into the environment, since every system is loosely coupled with the energetic state of its surroundings. Viewed in isolation, the system's dynamics are non-unitary (although the combined system plus environment evolves in a unitary fashion). Thus the dynamics of the system alone are irreversible. As with any coupling, entanglements are generated between the system and environment. These have the effect of sharing quantum information with—or transferring it to—the surroundings.

Decoherence has been used to understand the collapse of the wavefunction in quantum mechanics. Decoherence does not generate actual wave function collapse. It only provides an explanation for the observation of wave function collapse, as the quantum nature of the system "leaks" into the environment. That is, components of the wavefunction are decoupled from a coherent system, and acquire phases from their immediate surroundings. A total superposition of the global or universal wavefunction still exists (and remains coherent at the global level), but its ultimate fate remains an interpretational issue. Specifically, decoherence does not attempt to explain the measurement problem. Rather, decoherence provides an explanation for the transition of the system to a mixture of states that seem to correspond to those states observers perceive. Moreover, observation indicates that this mixture looks like a proper quantum ensemble in a measurement situation, as observing that measurements lead to the "realization" of precisely one state in the "ensemble."

Decoherence represents a challenge for the practical realization of quantum computers, since such machines are expected to rely heavily on the undisturbed evolution of quantum coherences. Simply put, they require that coherent states be preserved and that decoherence is managed, in order to actually perform quantum computation.

A bond wire 117 is located in through holes 119 to connect bonding pads 115 and 127. One advantage of this approach is that the flexibility of the bond wire 117 allows for thermal contractions and expansions of the system (e.g., top chip 109, bottom chip 105) as it is cooled to cryogenic temperatures (~10 mK) where the interior quantum circuit 100 is operated. An adhesion layer of gold can be placed on top of the bonding pads 115 and 127 on both the device layer 107 and the routing layer 111. The bonding pads 115 and 127 do not themselves carry quantum information and as such can be subject to some microwave losses as would occur when using a non-superconducting material such as gold.

Figure 3A:
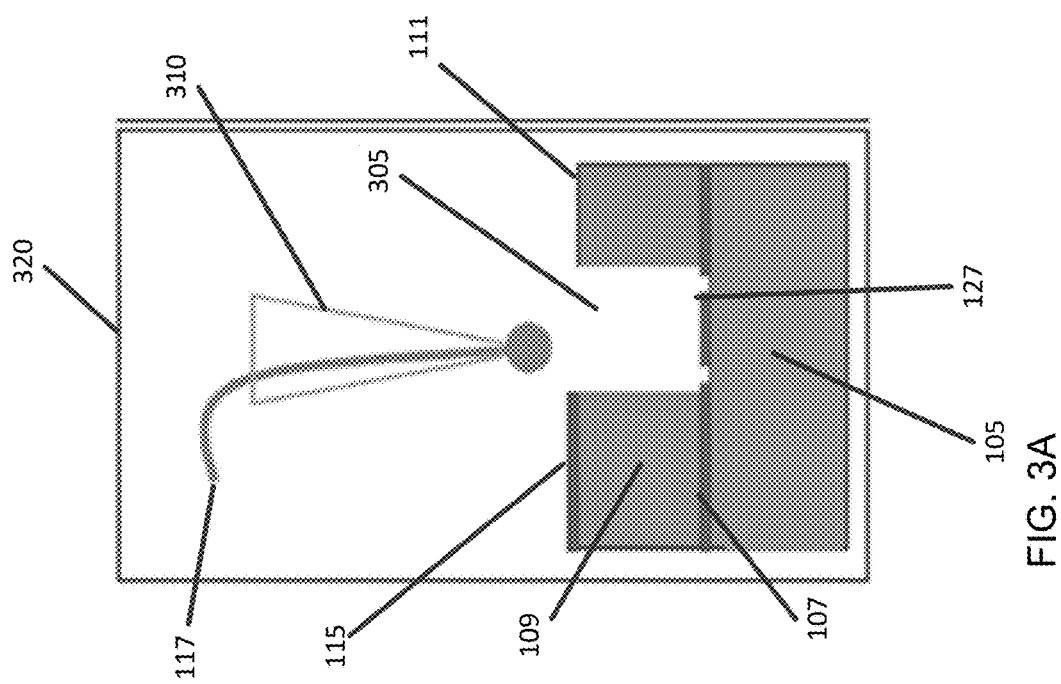
Figure 3C:
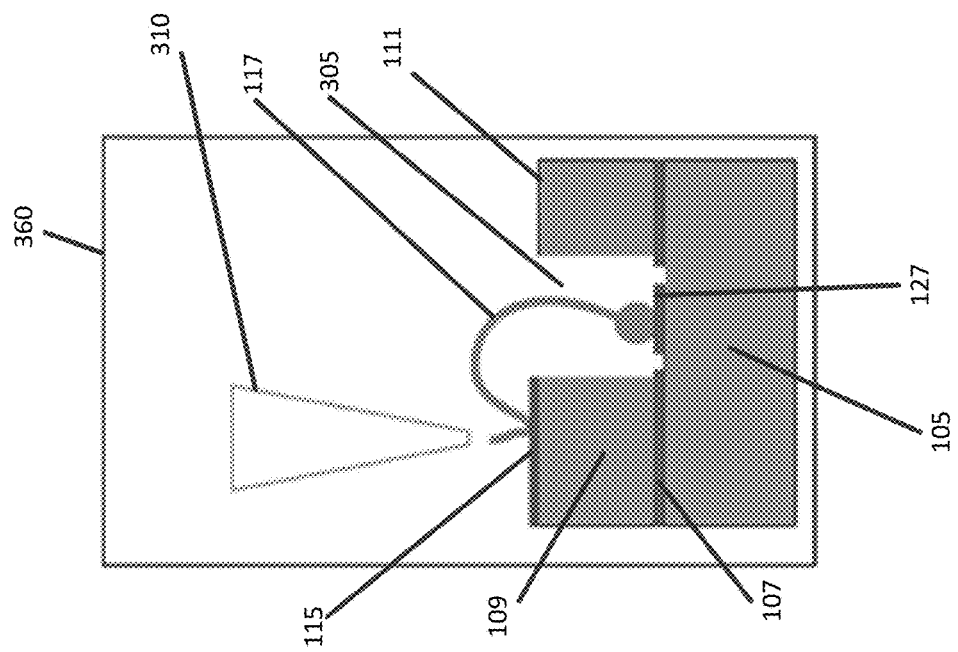

FIGS. 3A-3C illustrate a wire bonding process to the quantum circuit, in accordance with an embodiment of the present invention. FIGS. 3A-3C illustrate a ball bonding sequence for an interior quantum circuit 100 of FIG. 1, having a bond wire 117 attached to the interior quantum circuit 100.

In the first step 320 (FIG. 3A), the capillary tool 310 is aligned over the through hole 305, (which is, for example, is one of through holes 119), and the receiving bond pad 127 on the device layer 107. In the second step 340 (FIG. 3B), the capillary tool 310 and bond wire 117 is lowered into the through hole 305. The melted solder at the end of the bond wire 117 is attached to the receiver bond pad 127 using compression force and an ultrasonic pulse. In the final step 360 (FIG. 3C), the capillary tool 310 is removed from the through hole 305 and the other end of the bond wire 117 is attached to a corresponding bond pad 115 on the routing layer 111 using compression and an ultrasonic pulse.

Figure 4:
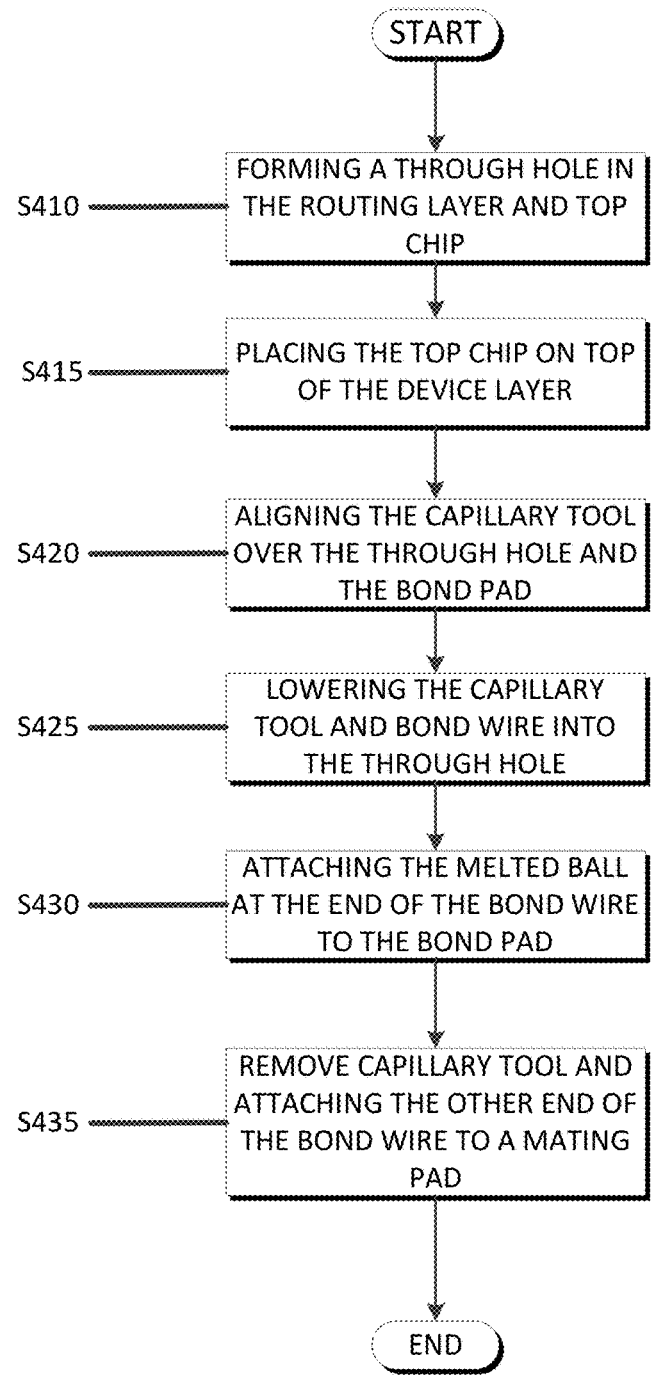
FIG. 4 illustrates a method of the wire bonding process to the quantum circuit, in accordance with an embodiment of the present invention.

FIG. 4 illustrates a method of the wire bonding process to the quantum circuit, in accordance with an embodiment of the present invention.

A through hole 119 is formed through the routing layer 111 and the top chip 109 (S410). The top chip 109 is placed on top of the device layer 107 (S415). These steps illustrate that the through hole 119 is formed while the top chip 109 is separate from the bottom chip 105, but, in other embodiments, the through hole 119 can be formed when the top chip 109 has already be aligned and placed on the bottom chip 105. The capillary tool 310 is aligned over the through hole 119 and the receiving bond pad 127 on the device layer 107 (S420). The capillary tool 310 and bond wire 117 are lowered into the through hole 119 (S425). The melted solder at the end of the bond wire 117 is attached to the receiver bond pad 127 using compression force and an ultrasonic pulse (S430). The capillary tool 310 is removed from the through hole 119 and the other end of the bond wire 117 is attached to a corresponding bond pad 115 on the routing layer 111 using compression and an ultrasonic pulse (S435).

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A quantum computer system comprising:
   a plurality of quantum circuits arranged in a two-dimensional layout; and
   wherein the plurality of quantum circuits includes at least one interior quantum circuit that is not along a perimeter of the two-dimensional layout, wherein the at least one interior quantum circuit comprises a plurality of layers, a top layer of the plurality of layers including a through hole to a bottom layer of the plurality of layers; and
   a signal wire positioned at least partially within the through hole and connecting the bottom layer to the top layer.

2. The quantum computer system of claim 1, wherein the bottom layer of the plurality of layers comprises a bottom chip having a device layer and the top layer of the plurality of layers comprises a top chip having a routing layer; and
   wherein the signal wire communicatively connects the device layer of the bottom chip to the routing layer of the top chip, and wherein the signal wire is not parallel to a plane of the two dimensional layout.

3. The quantum computer system of claim 2, wherein the through hole is formed by reactive ion etching or by laser milling.

4. The quantum computer system of claim 3, wherein the through hole has a diameter less than or equal to 1000 μm.

5. The quantum computer system of claim 2, wherein the interior quantum circuit further comprises:
   a first bonding pad located on the device layer; and
   a second bonding pad located on the routing layer.

6. The quantum computer system of claim 5, wherein the signal wire is connected to the first bonding pad and the second bonding pad.

7. A quantum computer system comprising:
   a plurality of quantum circuits arranged in a two-dimensional layout, the plurality of quantum circuits including at least one interior quantum circuit that is not along a perimeter of the two-dimensional layout, wherein the at least one interior quantum circuit includes a device layer and a routing layer;

a signal wire that connects the device layer to the routing layer, wherein the signal wire extends out of the two-dimensional layout of the plurality of quantum circuits; and a through hole formed in the routing layer, wherein the signal wire pass though the through hole.

8. The quantum computer system of claim 7, wherein the through hole is formed by reactive ion etching or by laser milling.

9. The quantum computer system of claim 7, wherein the through hole has a diameter less than or equal to 1000 μm.

10. The quantum computer system of claim 7, wherein the interior quantum circuit further comprises:

a first bonding pad located on the device layer; and a second bonding pad located on the routing layer.

11. The quantum computer system of claim 10, wherein the signal wire is connected to the first bonding pad and the second bonding pad.

* * * * *